United States Patent
Jenkins et al.

(10) Patent No.: US 6,738,248 B1
(45) Date of Patent: May 18, 2004

(54) ESD PROTECTION CIRCUIT FOR LOW AMPLITUDE SIGNALS

(75) Inventors: Michael O. Jenkins, San Jose, CA (US); Brett D. Hardy, Chaska, MN (US); Prashant K. Singh, Eden Prairie, MN (US); Donald C. Grillo, Lakeville, MN (US); Jeffrey S. Kueng, New Brighton, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/281,811

(22) Filed: Oct. 28, 2002

(51) Int. Cl.[7] .................................................. H02H 3/22
(52) U.S. Cl. ........................... 361/111; 361/90; 361/119
(58) Field of Search ........................ 361/93.1, 56, 91.1, 361/91.5, 90, 92, 111, 119

(56) References Cited

U.S. PATENT DOCUMENTS 6,400,541 B1 * 6/2002 Brett ............................ 361/56

* cited by examiner

*Primary Examiner*—Ronald W. Leja
(74) *Attorney, Agent, or Firm*—Westman, Champlin & Kelly

(57) ABSTRACT

An over-voltage protected integrated circuit is provided, which includes a discharge node, an input-output pad, a signal trace, which is coupled to the input-output pad, and a pair of back-to-back diodes, which is coupled between the first signal trace and the discharge node.

19 Claims, 2 Drawing Sheets

ESD PROTECTION CIRCUIT FOR LOW AMPLITUDE SIGNALS

BACKGROUND OF THE INVENTION

The present invention relates to semiconductor integrated circuits and, more particularly, to an ESD/over-voltage protection circuit for low amplitude signals.

Electrostatic discharge (ESD) is an event that can occur during the handling or processing of semiconductor devices. During a typical ESD event, a large amount of charge is deposited on a pad of an integrated circuit. If the charge is sufficient to increase the voltage level on the pad above the voltage level at which the circuit is intended to operate, the semiconductor devices connected to that pad can become damaged.

Complementary metal-oxide semiconductor (CMOS) devices are particularly susceptible to damage from ESD events because CMOS devices have a thin gate oxide layer. In addition, advancements in fabrication technology have enabled the geometries of semiconductor devices to be reduced progressively so that more devices can fit on a single integrated circuit. This has resulted in further reductions in the thickness of the gate oxide layers, making CMOS devices even more susceptible to damage by ESD events. Future thin oxide devices can also be damaged by repetitive exposure to voltages only slightly larger than a supply voltage.

Typical CMOS devices have therefore been protected by various types and combinations of resistors, punch-through devices, diodes, parasitic bipolar transistors, and silicon-controlled rectifiers (SCRs). For example, a typical ESD protection circuit includes a reverse-biased diode coupled between the signal trace and the relatively positive voltage supply rail, VDD and another reverse-biased diode coupled between the signal trace and the relatively negative voltage supply rail, VSS. However this ESD protection method is expected to be inadequate as the supply voltages and device sizes within integrated circuits continue to reduce.

A reverse-biased diode coupled between the signal trace and VDD does not begin to conduct current until the voltage on the signal trace rises above the voltage on VDD by 0.7 volts. If the integrated circuit has a nominal supply voltage of 1.0 volts, the resulting ESD diode turn-on voltage is about 1.7 volts. With the very thin gate oxide layers in technologies having such a low supply voltage, a voltage of 1.7 volts can damage the semiconductor devices that are coupled to the signal trace. Thus, this method ESD protection may not be sufficient for some current and future semiconductor technologies.

Improved protection circuits are therefore desired, which are capable of protecting against ESD events and repetitive exposure to voltages only slightly larger than a supply voltage.

SUMMARY OF THE INVENTION

One embodiment of the present invention is directed to an over-voltage protected integrated circuit, which includes a discharge node, an input-output pad, a signal trace, which is coupled to the input-output pad, and a pair of back-to-back diodes, which is coupled between the first signal trace and the discharge node.

Another embodiment of the present invention is directed to an integrated circuit, which includes a discharge node, first and second input-output pads, and first and second differential signal traces, which are coupled to the first and second input-output pads, respectively. A first voltage protection circuit is coupled between the first signal trace and the discharge node and conducts current if a voltage on the first signal trace is at least a threshold voltage greater than or less than a voltage on the discharge node. A second voltage protection circuit is coupled between the second signal trace and the discharge node and conducts current if a voltage on the second signal trace is at least the threshold voltage greater than or less than the voltage on the discharge node.

Yet another embodiment of the present invention is directed to a method of protecting semiconductor devices that are coupled to an input-output signal trace from over-voltages on the signal trace. The method includes: (a) biasing the semiconductor devices between first and second voltage supply terminals; and (b) conducting current between the first signal trace and a discharge node when a voltage on the first signal trace is greater than or less than a voltage on the discharge node by at least a threshold voltage.

DETAILED DESCRIPTION OF THE PREFERRED EMBODIMENTS

Figure 1:
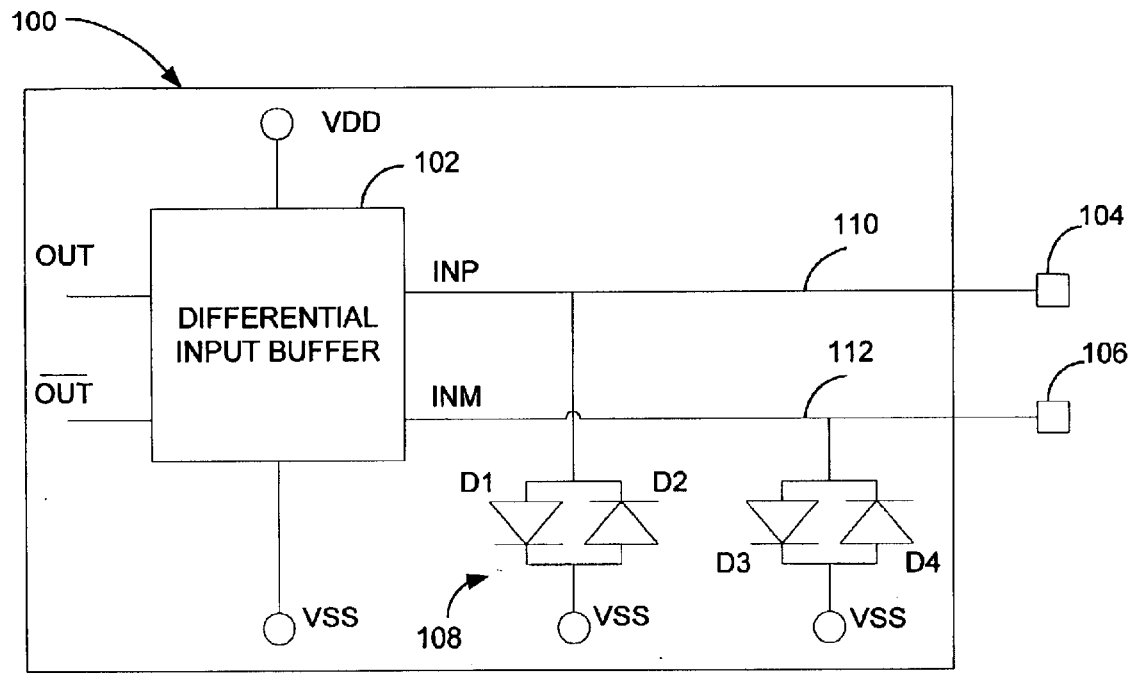
FIG. 1 is a schematic diagram illustrating an integrated circuit having an ESD/over-voltage protection circuit according to one embodiment of the present invention.

High-speed communication circuits frequently use differential buffers for transmitting and receiving data over differential transmission media, such as a two-wire transmission line. FIG. 1 is a schematic diagram illustrating an integrated circuit 100 having a differential input buffer 102, which is coupled to input-output pads 104 and 106 for transmitting a differential signal through pads 104 and 106.

Differential input buffer 102 has differential data inputs INP and INM and complementary data outputs OUT and $\overline{\text{OUT}}$. In an alternative embodiment, buffer 102 is single-ended, with only a single input IN. Input buffer 102 is biased between voltage supply terminals VDD and VSS. Voltage supply terminal VDD is a relatively positive voltage supply terminal, which is biased to a first voltage, and voltage supply terminal VSS is relatively negative voltage supply terminal, which is biased to a second voltage that is less than the first voltage. In one embodiment, VDD is biased to about 1.0 volts and VSS is biased to about 0 volts. Other supply voltages can also be used in alternative embodiments.

Differential inputs INP and INM are coupled to pads 104 and 106 through signal traces 110 and 112, respectively. Inputs INP and INM have a differential voltage of $V_{INP} - V_{INM}$. Differential inputs INP and INM have a common-mode voltage equal to:

$$\frac{V_{INP} + V_{INM}}{2}$$

Buffer 102 can be constructed to have any suitable common mode input voltage, with appropriate biasing of the internal elements of the buffer. For example, buffer 102 can have a common mode input voltage equal to the voltage on VSS or the voltage on VDD. In the embodiment shown in FIG. 1, buffer 102 has a common-mode input voltage equal to the voltage on VSS (e.g., 0 volts).

Integrated circuit 100 further includes an electrostatic discharge (ESD)/over-voltage protection circuit 108 for protecting the internal devices of buffer 102 during ESD events and from repetitive exposure to voltages only slightly larger than the supply voltage. During a typical ESD event a large amount of charge is deposited on one or both of the pads 104 and 106 of integrated circuit 100. Without circuit 108, if the charge is sufficient to increase voltage levels on pad 104 or 106 above the supply voltage of integrated circuit 100 the semiconductor devices in buffer 102 can become damaged.

Protection circuit 108 includes a first pair of back-to-back diodes D1 and D2, which are coupled between INP and voltage supply terminal VSS and a second pair of back-to-back diodes D3 and D4, which are coupled between INM and voltage supply terminal VSS. Diode D1 has an anode coupled to signal trace 110 and cathode coupled to VSS. Diode D2 has an anode coupled to VSS and a cathode coupled to signal trace 110. Diode D3 has an anode coupled to signal trace 112 and a cathode coupled to signal trace VSS. Diode D4 has an anode coupled to VSS and a cathode coupled to the signal trace 112.

Diodes D1–D4 can be formed on integrated circuit 100 in any known manner, as is well known in the art. For example, each of the diodes D1–D4 can be formed with the n-p or p-n junction in an NMOS or PMOS transistor. The gate and drain of the transistor are coupled together to form an anode, and the source of the transistor forms a cathode.

Diodes D1–D4 protect the devices within buffer from ESD events on pads 104 and 106 without interfering with the differential signal received on differential inputs INP and INM as long as the differential signals have a relatively low amplitude. If the differential signal has a common-mode voltage of VSS and the voltage on pad 104 or 106 rises (or falls) to a voltage that is greater than (or less than) the voltage on VSS by at least the threshold voltage of diodes D1–D4 (e.g., 0.7 volts), the protection diode that is connected to that pad and is forward-biased will begin to conduct current. This provides a discharge path to the voltage supply rails. The differential signal on differential inputs INP and INM can therefore range from +0.7 volts to −0.7 volts relative to VSS without being "clipped" by diodes D1–D4. However any ESD event that would otherwise be sufficient to increase or decrease the voltage level on pad 104 or pad 106 by more than +/−0.7 volts relative to VSS would therefore be sufficient to turn on one or more of the diodes D1–D4, resulting in no damage to the internal devices in buffer 102.

In this example, the maximum voltage that is seen by any semiconductor device in buffer 102 that is connected to pad 104 or pad 106 and is referenced to VSS is +/−0.7 volts, which is less than the supply voltage between VDD and VSS. With a maximum voltage of +/−0.7 volts, the semiconductor devices within buffer 102 can be coupled directly to pads 104 and 106 without risking device damage due ESD events. For example, an NMOS device having a damage threshold of less than 1.7 volts can be coupled directly to one of the pads 104 or 106 and still remain protected from ESD events.

Figure 2:
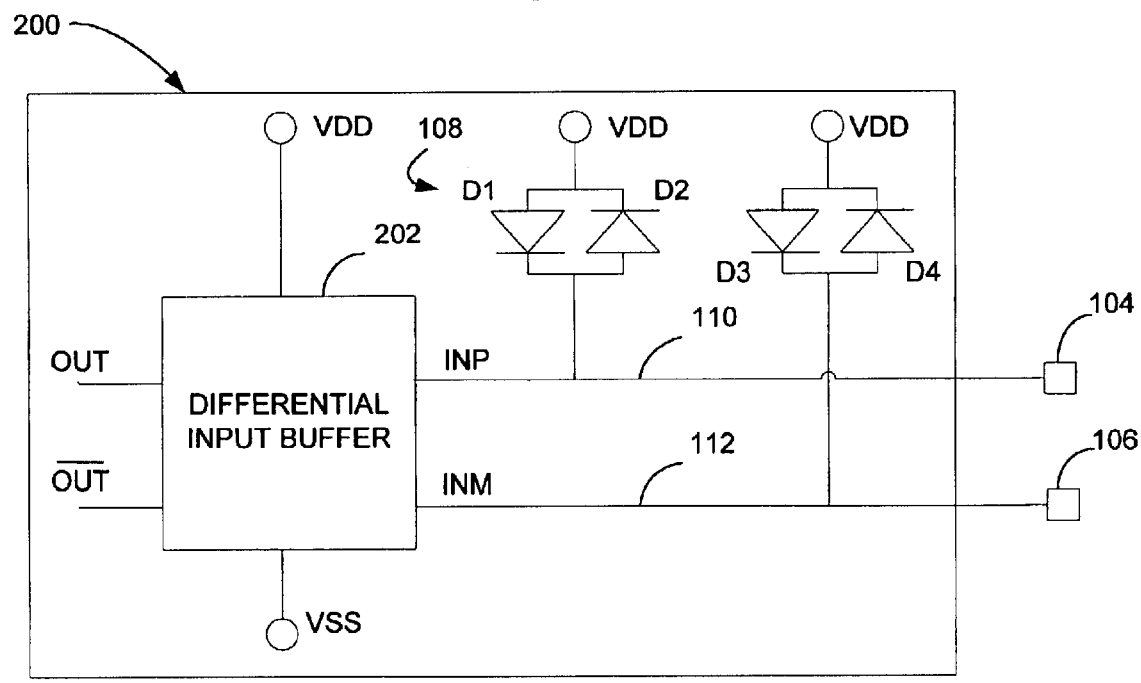
FIG. 2 is a schematic diagram illustrating an integrated circuit having an ESD/over-voltage protection circuit according to an alternative embodiment of the present invention.

FIG. 2 is a schematic diagram illustrating an integrated circuit 200 according to an alternative embodiment of the present invention. The same reference numerals are used in FIG. 2 as were used in FIG.1 for the same or similar elements. In this embodiment, integrated circuit 200 includes a differential input buffer 202, which has a common-mode input voltage on inputs INP and INM equal to the voltage on VDD (e.g., 1.0 volts).

The semiconductor devices in buffer 202 can be protected from ESD events in this embodiment by coupling protection circuit 108 between VDD and signal traces 110 and 112. Back-to-back diodes D1 and D2 are coupled between VDD and signal trace 110, and back-to-back diodes D3 and D4 are coupled between VDD and signal trace 112.

ESD events that are sufficient to increase (or decrease) the voltage level on at least one of the pads 104 and 106 to a voltage that is 0.7 volts greater than (or less than) the voltage on VDD will be sufficient to turn on one or more of the diodes D1–D4 and thereby limit the voltage levels applied to the devices within buffer 202. Semiconductor devices in buffer 202 that are referenced to VDD and are connected to one of the signal traces 110 and 112 will therefore not be damaged by ESD events on pads 104 to 106.

Protection circuit 108 can be used to protect semiconductor devices within differential input buffers such as those shown in FIGS. 1 and 2, differential output buffers or any other circuit that is connected a differential signal trace that is susceptible to ESD events. For example, differential input buffers 102 and 202 in FIGS. 1 and 2 can be replaced with differential output buffers in alternative embodiments of the present invention.

Figure 3:
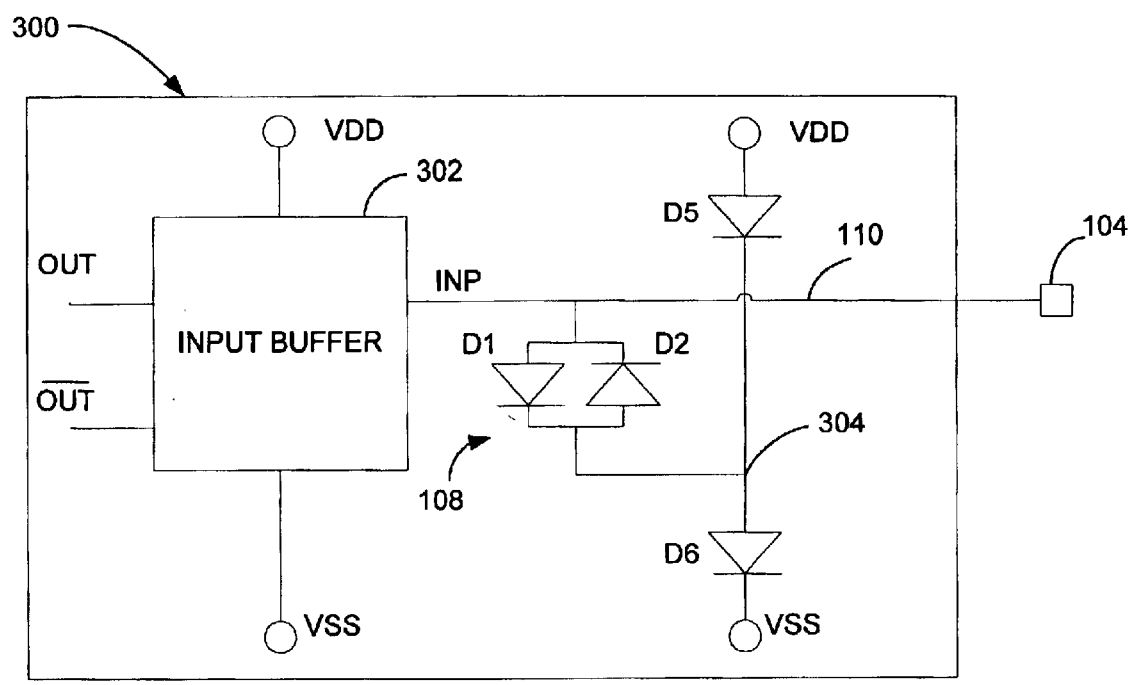
FIG. 3 is a schematic diagram illustrating an integrated circuit having an ESD/over-voltage protection circuit according to another alternative embodiment of the present invention.

FIG. 3 is a schematic diagram of an integrated circuit 300 according to another alternative embodiment of the present invention. Again, the same reference numerals are used in FIG. 3 as were used in FIGS. 1 and 2 for the same or similar elements. Integrated circuit 300 has an input buffer 302 with a single-ended input IN, which is coupled to input-output pad 104 through signal trace 110. In this embodiment, protection circuit 108 is not coupled directly to the voltage supply terminal VSS. Rather, protection circuit 108 is coupled between signal trace 110 and an intermediate node 304. Intermediate node 304 provides a discharge path from signal trace 110 to voltage supply terminals VDD and VSS through diodes D5 and D6.

Diode D5 has an anode coupled to VDD and a cathode coupled to node 304. Diode D6 has an anode coupled to node 304 and a cathode coupled to VSS. Diodes D5 and D6 clamp the voltage between VDD and VSS to about 1.4 volts. By connecting protection diodes D1 and D2 to node 304, the I/O voltage on pad 104 is constrained between $V_{D1}+V_{D6}$ (about +1.4 volts) and VDD−($V_{D5}+V_{D2}$) (about −0.4 volts). Other discharge devices can be used in replace of diodes D5 and D5, as long as the devices provide a discharge path for over-voltages experienced on pad 104.

In a further alternative embodiment, buffer 304 can be converted into a differential buffer similar to buffer 102 in FIG. 1. In this embodiment, diodes D3 and D4 (shown in FIG. 1) would be coupled between signal trace 112 and intermediate node 304, similar to diodes D1 and D2. Any intermediate node can be used, as long as the node provides a discharge path to a supply rail.

A further benefit of the embodiment shown in FIG. 3 is that the input-output pad 104 has potentially reduced capacitive loading as compared to pads 104 and 106 in FIGS. 1 and 2. The reverse-biased diode capacitance seen by pad 104 in FIG. 3 is a combination of two parasitic diode capacitances. However this potential benefit disappears if the intermediate node is heavily biased to VSS since VSS has a large capacitance. Biasing to VSS might be common in differential embodiments.

Although the present invention has been described with reference to preferred embodiments, workers skilled in the art will recognize that changes may be made in form and detail without departing from the spirit and scope of the invention. For example, the back-to-back diodes can be used to protect individual, single-ended integrated circuit I/O's or differential I/O's. The term "coupled" can include various types of connections or couplings and can include a direct connection or a connection thorough one or more intermediate components. The term "input-output pad" as used in the specification and the claims can include an input-only pad, and output-only pad or a bi-directional pad. The voltage supply terminals can include any voltage reference terminals, whether biased to the same voltage as the main voltage supply rails or to an intermediate voltage. Also, the protection circuit can be used with a variety of other semiconductor technologies, in addition to CMOS.

What is claimed is:

1. An integrated circuit comprising:
   a first voltage supply terminal biased at a first voltage;
   a second voltage supply terminal biased at a second voltage, which is less than the first voltage;
   a discharge node, which is formed by one of the first and second voltage supply terminals;
   a first input-output pad;
   a first signal trace, which is coupled to the first input-output pad; and
   a first pair of back-to-back diodes, which is coupled between the first signal trace and the discharge node.

2. The integrated circuit of claim 1 wherein:
   the first pair of back-to-back diodes comprises a first diode, which has an anode coupled to the first signal trace and a cathode coupled to the discharge node, and a second diode, which has an anode coupled to the discharge node and a cathode coupled to the first signal trace.

3. The integrated circuit of claim 1 and further comprising:
   a second input-output pad;
   a second signal trace, which is coupled to the second input-output pad and forms a differential pair of signal traces with the first signal trace; and
   a second pair of back-to-back diodes, which is coupled between the second signal trace and the discharge node.

4. The integrated circuit of claim 3 wherein:
   the second voltage supply terminal forms the discharge node; and
   the first and second signal traces have a common-mode voltage substantially equal to the second voltage.

5. The integrated circuit of claim 3 wherein:
   the first voltage supply terminal forms the discharge node; and
   the first and second signal traces have a common-mode voltage substantially equal to the first voltage.

6. The integrated circuit of claim 3 and further comprising:
   a differential buffer coupled to the first and second signal traces and having a common-mode voltage substantially equal to a voltage on the discharge node.

7. The integrated circuit of claim 3 wherein the first and second signal traces have a differential voltage swing that is less than twice a turn-on voltage of the first and second pairs of back-to-back diodes.

8. An integrated circuit comprising:
   a first voltage supply terminal biased at a first voltage;
   a second voltage supply terminal biased at a second voltage, which is less than the first voltage;
   a discharge node, which is formed by one of the first and second voltage supply terminals;
   first and second input-output pads;
   first and second differential signal traces, which are coupled to the first and second input-output pads, respectively;
   first voltage protection means, which is coupled between the first signal trace and the discharge node and conducts current if a voltage on the first signal trace is at least a threshold voltage greater than or less than a voltage on the discharge node; and
   second voltage protection means, which is coupled between the second signal trace and the discharge node and conducts current if a voltage on the second signal trace is at least the threshold voltage greater than or less than the voltage on the discharge node.

9. The integrated circuit of claim 8 wherein
   the first voltage protection means comprises first and second back-to-back diodes; and
   the second voltage protection means comprises third and fourth back-to-back diodes.

10. The integrated circuit of claim 9 wherein the first and second differential signal traces have a differential voltage swing that is less than twice a turn-on voltage of the first and second back-to-back diodes and the third and fourth back-to-back diodes.

11. The integrated circuit of claim 8 wherein:
    the second voltage supply terminal forms the discharge node; and
    the first and second differential signal traces have a common-mode voltage substantially equal to the second voltage.

12. The integrated circuit of claim 8 wherein:
    the first voltage supply terminal forms the discharge node; and
    the first and second differential signal traces have a common-mode voltage substantially equal to the first voltage.

13. The integrated circuit of claim 8 and further comprising:
    a differential buffer coupled to the first and second differential signal traces and having a common-mode voltage substantially equal to a voltage on the discharge node.

14. A method of protecting semiconductor devices that are coupled to a first input-output signal trace from over-voltages on the first signal trace, the method comprising:
    (a) biasing the semiconductor devices between first and second voltage supply terminals; and
    (b) conducting current between the first signal trace and a discharge node when a voltage on the first signal trace is greater than or less than a voltage on the discharge node by at least a threshold voltage, wherein the discharge node is formed by one of the first and second voltage supply terminals.

15. The method of claim 14 wherein:
    step (b) comprises conducting current through a pair of back-to-back diodes.

16. The method of claim 14 wherein the first input-output signal trace and a second input-output signal trace together form a differential pair of signal traces having a common-mode voltage substantially equal to the voltage on the discharge node, and the method further comprises:

(c) conducting current between the second signal trace and the discharge node when a voltage on the second signal trace is greater than or less than the voltage on the discharge node by at least the threshold voltage.

17. The method of claim 16 wherein the first voltage supply terminal is biased at a greater voltage than the second voltage supply terminal and forms the discharge node.

18. The method of claim 16 wherein the first voltage supply terminal is biased at a greater voltage than the second voltage supply terminal and the second voltage supply terminal forms the discharge node.

19. An integrated circuit comprising:

a first voltage supply terminal biased at a first voltage;

a second voltage supply terminal biased at a second voltage, which is less than the first voltage;

a discharge node;

first and second input-output pads;

first and second differential signal traces, which are coupled to the first and second input-output pads, respectively;

first voltage protection means, which is coupled between the first signal trace and the discharge node and conducts current if a voltage on the first signal trace is at least a threshold voltage greater than or less than a voltage on the discharge node;

second voltage protection means, which is coupled between the second signal trace and the discharge node and conducts current if a voltage on the second signal trace is at least the threshold voltage greater than or less than the voltage on the discharge node;

a first diode having an anode coupled to the first voltage supply terminal and a cathode coupled to the discharge node; and a second diode having an anode coupled to the discharge node and a cathode coupled to the second voltage supply terminal.

* * * * *